(12) United States Patent
Hopwood

(10) Patent No.: US 9,006,972 B2
(45) Date of Patent: Apr. 14, 2015

(54) MICROPLASMA GENERATOR AND METHODS THEREFOR

(75) Inventor: Jeffrey A. Hopwood, Needham, MA (US)

(73) Assignee: Trustees of Tufts College, Medford, MA (US)

( * ) Notice: Subject to any disclaimer, the term of this patent is extended or adjusted under 35 U.S.C. 154(b) by 709 days.

(21) Appl. No.: 13/266,396

(22) PCT Filed: Apr. 27, 2010

(86) PCT No.: PCT/US2010/032571
§ 371 (c)(1),
(2), (4) Date: Oct. 26, 2011

(87) PCT Pub. No.: WO2010/129277
PCT Pub. Date: Nov. 11, 2010

(65) Prior Publication Data
US 2012/0045863 A1    Feb. 23, 2012

Related U.S. Application Data

(60) Provisional application No. 61/173,334, filed on Apr. 28, 2009.

(51) Int. Cl.
*H01J 19/80*        (2006.01)
*H01J 7/46*         (2006.01)
(Continued)

(52) U.S. Cl.
CPC ............ *H01L 31/1876* (2013.01); *C23C 16/24* (2013.01); *C23C 16/511* (2013.01); *C23C16/545* (2013.01); *H01J 37/32366* (2013.01); *H01J 37/32825* (2013.01); *H05H 1/46* (2013.01); *Y02E 10/50* (2013.01); *H05H 2001/4622* (2013.01)

(58) Field of Classification Search
USPC .................................. 315/39, 111.01, 111.21
See application file for complete search history.

(56) References Cited

U.S. PATENT DOCUMENTS 5,017,404 A    5/1991    Paquet et al.
5,733,511 A    3/1998    De Francesco
(Continued)

FOREIGN PATENT DOCUMENTS

JP    2004-128159    4/2004
JP    2004-220935    8/2004
(Continued)

OTHER PUBLICATIONS

Jaeho Kim, Makoto Katsurai, Dongmin Kim, and Hyroyuki Ohsaki; Microwave-excited atmospheric-pressure plasma jets using a microstrip line; Applied Physics Letters 93, 191505 (2008); American Institute of Physic's; Nov. 13, 2008.

*Primary Examiner* — Douglas W Owens
*Assistant Examiner* — Thai Pham
(74) *Attorney, Agent, or Firm* — Preti Flaherty Beliveau & Pachios LLP

(57) ABSTRACT

A low-temperature, atmospheric-pressure microplasma generator comprises at least one strip of metal on a dielectric substrate. A first end of the strip is connected to a ground plane and the second end of the strip is adjacent to a grounded electrode, with a gap being defined between the second end of the strip and the grounded electrode. High frequency power is supplied to the strip. The frequency is selected so that the length of the strip is an odd integer multiple of ¼ of the wavelength traveling on the strip. A microplasma forms in the gap between the second end of the strip and the grounded electrode due to electric fields in that region. A microplasma generator array comprises a plurality of strongly-coupled resonant strips in close proximity to one another. At least one of the strips has an input for high-frequency electrical power. The remaining strips resonate due to coupling from the at least one powered strip. The array can provide a continuous line or ring of plasma. The microplasma generator can be used to alter the surface of a substrate, such as by adding material (deposition), removal of material (etching), or modifying surface chemistry.

25 Claims, 11 Drawing Sheets

(51) Int. Cl.
- *H01L 31/18* (2006.01)
- *C23C 16/24* (2006.01)
- *C23C 16/511* (2006.01)
- *C23C 16/54* (2006.01)
- *H01J 37/32* (2006.01)
- *H05H 1/46* (2006.01)

(56) References Cited

U.S. PATENT DOCUMENTS

| | | | |
|---|---|---|---|
| 5,938,854 A * | 8/1999 | Roth | 134/1 |
| 7,159,536 B1 * | 1/2007 | Grosse et al. | 118/723 MW |
| 2004/0164682 A1 * | 8/2004 | Hopwood et al. | 315/111.21 |
| 2007/0170996 A1 * | 7/2007 | Dutton et al. | 331/126 |
| 2008/0073202 A1 | 3/2008 | Lee et al. | |
| 2009/0065177 A1 | 3/2009 | Ouyang | |

FOREIGN PATENT DOCUMENTS

| | | |
|---|---|---|
| JP | 2008-034735 | 2/2008 |
| KR | 10-0345543 | 7/2002 |
| KR | 10-2008-0043597 | 5/2008 |
| KR | 10-2009-0037438 | 4/2009 |
| KR | 10-2009-0055515 | 6/2009 |

\* cited by examiner

U.S. 9,006,972 B2

MICROPLASMA GENERATOR AND METHODS THEREFOR

CROSS-REFERENCE TO RELATED APPLICATION

This application claims the benefit of U.S. Provisional Application No. 61/173,334, filed Apr. 28, 2009.

STATEMENT REGARDING FEDERALLY SPONSORED RESEARCH OR DEVELOPMENT

The invention was made with support from Grant DE-SC0001923 from the U.S. Department of Energy. The United States Government has certain rights in the invention.

BACKGROUND OF THE INVENTION

There is a need for improved technologies for processing the surfaces of substrates. Photovoltaic (PV) devices, for example, are typically fabricated by depositing thin film layers of various materials, such as silicon and metal, on a substrate material, such as a glass sheet, to form a solar cell.

PV devices are not yet cost competitive with fossil fuels. Currently, the manufacturing of PV devices is based on technologies originally developed by the semiconductor industry. Semiconductor chips are extremely sophisticated, but have a small area (~1 $cm^2$). By contrast, photovoltaic devices are relatively simple devices with a very large area. The technologies developed to create $10^8$ transistor chips are not necessarily well-suited to the production of a single large diode, i.e. a PV cell. Nonetheless, chip technologies are currently being dimensionally scaled for PV production. Current PV manufacturing tools employ high-vacuum technology, and sequentially transfer large sheets of glass from chamber to chamber, coating the glass substrates with layers of silicon and metal to form the solar cells. This so-called batch processing approach is not consistent with high-volume, low-cost manufacturing.

BRIEF SUMMARY OF THE INVENTION

According to one aspect of the invention, a microplasma generator comprises at least one strip of metal. A first end of the strip of metal is connected to an adjacent ground plane and the second end of the strip of metal is adjacent to a grounded electrode, with a gap being defined between the second end of the strip and the grounded electrode. High frequency power is supplied to the strip, preferably at a location where the input impedance matches that of the power supply. In certain embodiments, the frequency is selected so that the length of the strip is an odd integer multiple of ¼ of the wavelength of the signal traveling on the strip. A microplasma forms in the gap between the second end of the strip and the grounded electrode due to electric fields in that region.

In another aspect of the invention, a microplasma generator comprises an array of metal strips in close proximity to one another. At least one of the strips has an input for high-frequency electrical power. The remaining strips resonate due to coupling from the at least one powered strip. Microplasma forms in the gaps between the ends of each strip and a ground electrode. In certain embodiments, the strips of the array are arranged such that the gaps are substantially adjacent to one another, and the plasma formed in each gap overlaps to produce a substantially continuous plasma. In one embodiment, the gaps are collinear and produce a "line" of plasma. In another embodiment, the gaps are arranged in a generally circular configuration, and produce a plasma-ring.

In one embodiment, the frequency of the power provided to the array is selected to correspond to an excitation frequency of an operating mode of the coupled-array. In certain embodiments, two or more frequencies, each corresponding to a respective excitation frequency of an operating mode, are provided to improve the uniformity of the plasma.

According to yet another aspect of the invention, a microplasma generator comprising at least one metal strip is used to alter the surface of a substrate. In certain embodiments, the surface of the substrate can be altered by the addition of material by using a chemically reactive gas, such as $SiH_4$ (i.e., deposition); by the removal of material using a suitable reactive gas, such as $CF_4$ (i.e., etching); or by the modification of the surface chemistry of the substrate using oxygen, water vapor, etc.

In certain methods and systems of the invention, the microplasma generator of the invention is used to deposit materials on a substrate in a "roll-to-roll coating" process. The substrate material can be supplied in a roll form, and the rolled substrate material is unrolled, processed by the microplasma generator, which is preferably a microplasma array that produces a linear plasma, and the substrate is then re-rolled. The substrate can be processed by depositing a thin film coating on the substrate. An advantage of this method is that the microplasmas are cold, allowing the use of low cost substrate materials, such as plastics. Also, the microplasmas are operated at or near atmospheric pressure, eliminating the need for expensive differential pumping as the rolled material enters and exits the processing region. In certain embodiments, the microplasma generator is used to deposit at least one layer of material on a substrate to provide a photovoltaic (PV) device.

BRIEF DESCRIPTION OF THE SEVERAL VIEWS OF THE DRAWINGS

Other features and advantages of the invention will be apparent from the following description of the preferred embodiments thereof and from the claims, taken in conjunction with the accompanying drawings, in which:

DETAILED DESCRIPTION OF THE INVENTION

This application claims the benefit of U.S. Provisional Application No. 61/173,334, filed Apr. 28, 2009, the entire contents of which are incorporated herein by reference.

Figure 1A:
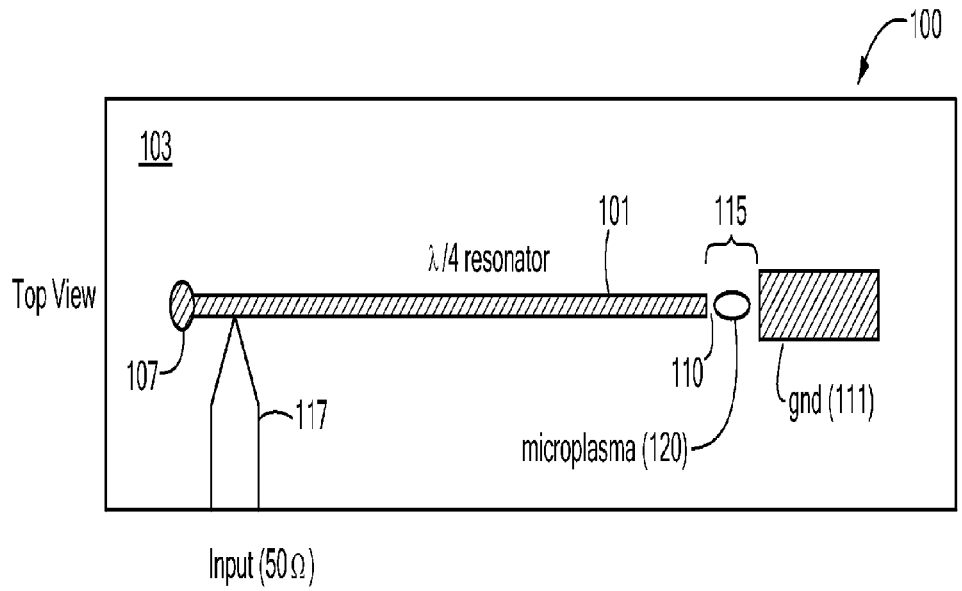
FIG. 1A is a top view of a quarter-wave linear resonator and generated microplasma according on one aspect of the invention.
Figure 1B:
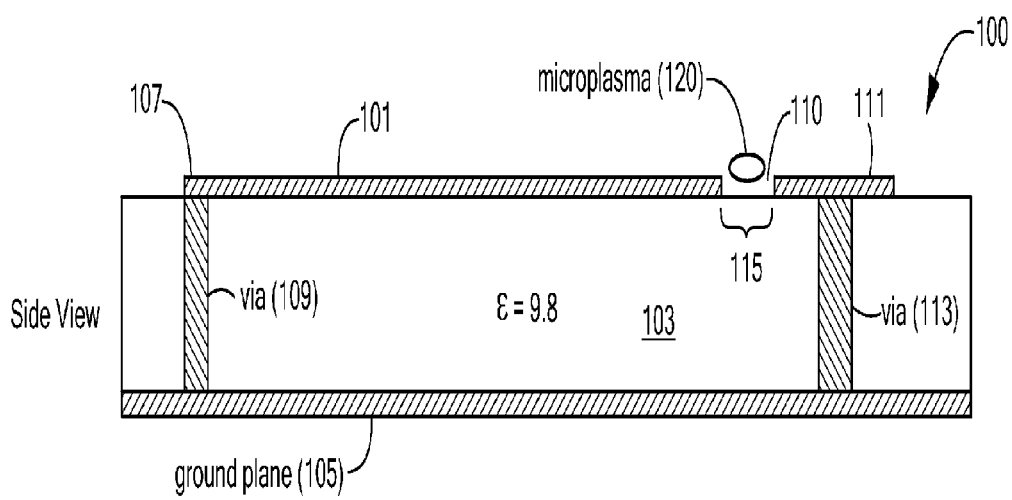
FIG. 1B is a side cross-sectional view of the linear resonator of FIG. 1A.

FIGS. 1A and 1B illustrate top and side cross-section views, respectively, of a microplasma generator 100 according to one aspect of the invention. The generator 100 in this embodiment comprises a single strip of metal 101 supported on the surface of a dielectric material 103. A ground plane 105 is provided on the dielectric material 103, opposite the metal strip 101. A first end 107 of the metal strip 101 is connected to the ground plane 105 through a via 109 in the dielectric material 103. A ground electrode 111 is connected to the ground plane 105 through via 113. A gap 115 is defined in the area between the second end 110 of the metal strip 101 and the ground electrode 111.

A source 117 of high frequency power is connected to the strip 101, preferably at a location on the strip where the input impedance matches that of the power supply. The operating frequency of the power is preferably selected such that the length of the strip 101 is an odd integer multiple of ¼ of the wavelength traveling on the strip. A microplasma 120 forms in the gap 115 between the second end 110 of the strip 101 and the ground electrode 111 due to the electric fields in that region. In the embodiment shown in FIGS. 1A and 1B, the strip 101 is ¼ the wavelength and the strip 101 is supported above the ground plane 105 on a dielectric layer 103 having a relative dielectric constant of 9.8.

According to one aspect, the microplasma 120 that forms in the gap 115 is a low-temperature (i.e., "cold") atmospheric-pressure plasma. As is known in the art, plasma is an ionized gas, in which electrons heated by an electric field are responsible for ionizing gas atoms. At a low gas pressure, the hot electrons inside a plasma have relatively few collisions with the gas atoms. Therefore, the gas remains cool, as one observes in a fluorescent light (p~1 Torr). At or near atmospheric pressure (p~760 Torr), however, the free electrons in the plasma frequently collide with gas atoms and heat the gas to very high temperatures (e.g., 5,000-10,000 K). Examples of atmospheric plasmas include lighting and welding arcs. High temperature plasmas tend to be destructive, and are unsuitable for many industrial processes, including PV manufacturing.

Recently, plasma generators have been developed that produce plasma that is relatively low-temperature at or near atmospheric pressure. These low-temperature atmospheric-pressure plasmas are known as "cold" plasmas, and are characterized by their lower gas temperatures, often less than 500 K and generally in the range of 300-1000 K. These cold plasma discharges are not constricted arcs but are typically quite small (<1 mm) and do not cover relatively broad areas of up to 1 m² as can be required for industrial processes. These low-temperature atmospheric-pressure plasmas, however, are advantageous for numerous industrial processing applications, and in particular for processing inexpensive commodity materials that are sensitive to heat, such as plastics.

An example of a microplasma generator for generating cold plasma at atmospheric pressure is a split ring resonator (SRR).

In this device, the microplasma is generated in a discharge gap (e.g., 25 μm) formed in a ring-shaped microstrip transmission line. The cold atmospheric plasma is generated by coupling microwave energy (0.4-2.4 GHz) to plasma electrons using a resonating circuit. The circuit generates high electric fields (E~10 MV/m) which heat the plasma electrons without strong coupling to the rotational and vibrational modes of the gas molecules (i.e., without generating significant heat). The gas temperature within the plasma can be measured using the rotational spectra of nitrogen molecules, and is typically in the range of 100-400° C. Exemplary embodiments of SRR plasma generators are described in U.S. Pat. No. 6,917,165 to Hopwood et al., the entire teachings of which are incorporated herein by reference.

The microplasma generator of the present invention preferably employs a microwave resonating circuit to generate a low-temperature atmospheric-pressure plasma. Of the known cold plasma technologies, the microwave resonator approach offers the most intense electron density while maintaining the lowest gas temperature and the longest electrode life.

Figure 2:
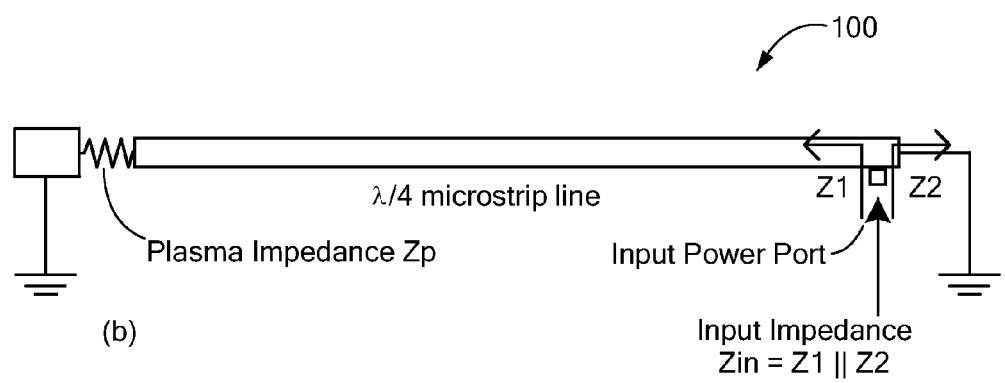
FIG. 2 illustrates the equivalent circuit of a single resonator operated at its resonance frequency.

FIG. 2 illustrates the equivalent circuit of a single resonator 100 operated at its resonance frequency. In this embodiment, the resonator consists of a microstrip transmission line fabricated on a substrate of high dielectric constant ($\in_r$=10.2). The design is based on the quarter-wavelength resonator, which maximizes the rf voltage difference across a 200 μm discharge gap, formed between the end of the resonator and ground.

The microwave power is connected directly to the resonator without a matching network because the physical position of the input port has been chosen to match the power supply impedance (50Ω). The input impedance of the quarter-wave resonator is based on the equivalent transmission line circuit of FIG. 2 and is calculated by the parallel impedance of the two-line segments ($Z_1 \| Z_2$), which is deduced in the transmission line model of J. Choi et al., *Plasma Sources Sci. Technol.* 18, 025029 (2009), the entire contents of which are incorporated herein by reference. The resonance frequency of the single-line resonator without plasma is $f_0$=473.9 MHz The impedance of the microplasma [$Z_p=R_p+jX_p$ (Ω)] is deduced from the ratio of forward and reflected power ($s_{11}$) versus frequency using the method described in F. Iza and J. Hopwood, *Plasma Sources Sci. Technol.* 14, 397 (2005), the entire contents of which are incorporated herein by reference. In summary, the plasma impedance is complex, with both resistive and capacitive components. The resonance frequency shifts from $f_0$ to 456 MHz due to plasma sheath capacitance ($X_p$=−910Ω) and the resonance absorption curve broadens due to resistive loading of the resonator by the microplasma ($R_p$=492Ω).

One drawback to the existing cold plasma generators is that their geometries are not optimized for industrial processing, particularly processes for altering the surface of a substrate.

The SRR device, for example, is limited to a single "point" geometry, which severely limits its effectiveness for processing a wide-area substrate.

An advantage of the microplasma generator 100 of FIGS. 1A and 1B that that a large number of such microstrip resonators can be provided in close proximity and arranged such that the gaps 115 are adjacent to one another. The microplasmas formed in each gap overlap to produce a substantially continuous plasma discharge over an extended area. In one embodiment, the microstrip resonators are arranged to that the gaps are collinear with one another and produce a continuous "line" of plasma.

Figure 3:
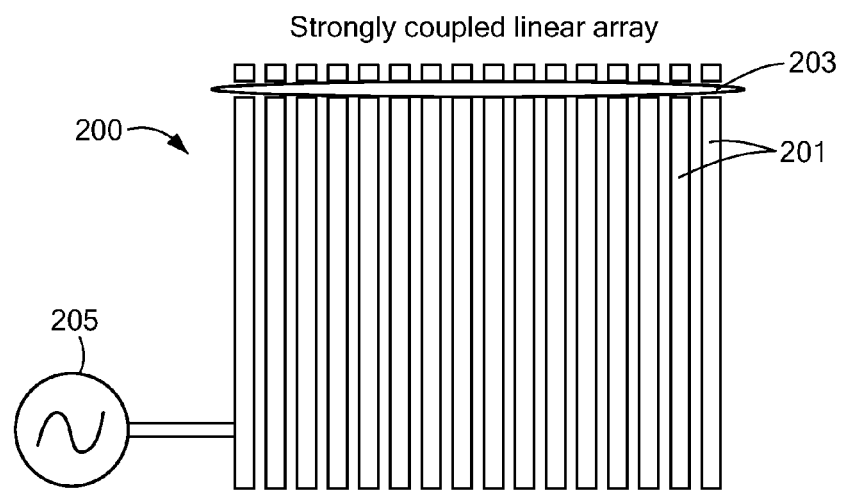
FIG. 3 is a top view of an array of linear resonators for producing a line of overlapping microplasmas.

An example of a linear array 200 of metal strips 201 according to one embodiment of the invention is illustrated in FIG. 3. In this embodiment, the linear microplasma array 200 is driven by strongly-coupled quarter-wave microstrip resonators. The array of strips generates overlapping microplasmas, producing a substantially continuous plasma line 203. For illustration purposes, only sixteen strips are shown, though it will be understood that the array can include more or less strips. In preferred embodiments, the array 200 comprises a large number (e.g., ~100 or more) of strips. The strips can be micromachined on an rf circuit board. It is generally impractical to drive each resonator with an individual power source (and phase coherency would be lost). Accordingly, in a preferred embodiment, the linear array of resonators is driven from a single power source 205 with the aid of a strong resonant coupling. Coupled mode theory provides an accurate model for energy-exchange among resonators.

Coupled-mode theory describes the interactions between resonant systems according to the following equation:

$$\dot{a}_m(t) = (i\omega_m - \Gamma_m)a_m(t) + \sum_{n \leftrightarrow m} i\kappa_{mn}a_n(t) + F_m(t) \quad \text{(Eq. 1)}$$

where $a_m$ is the energy stored in resonant system m with resonant frequency $\omega_m$ and damping $\Gamma_m$. The coupling coefficient between m and n is given by $K_{mn}$ and the forcing function is $F_m(t)$. If all systems have identical resonance frequencies, and $(K_{mn})^2/\Gamma_m\Gamma_n>1$, then energy is efficiently transferred from m to n and n to m.

Strong resonant coupling has been demonstrated in the case of two SRR resonators fabricated with a common ground plane separating the two SRRs. This system is not appropriate for a linear plasma, however, since the two microplasmas are completely isolated from one another by the continuous ground plane. A substantial modification of the SRR is necessary to produce a microplasma generator that is conveniently fabricated in arrays. The SRR is a half-wave resonator with a symmetric voltage standing wave. By choosing a plane of symmetry that extends through the center of the ring and the discharge gap, it is possible to ground the ring at the symmetry plane and insert a ground plane at the mid-gap location without affecting the resonance. Modifying the half-wave resonator by converting it to a straight line produces the λ/4 resonator shown in FIGS. 1A and 1B. The location of the power input 117 allows one to impedance match to any real driving source (typically 50Ω). The two grounding vias 109, 113 represent the grounding induced by the vertical plane of symmetry.

Figure 4:
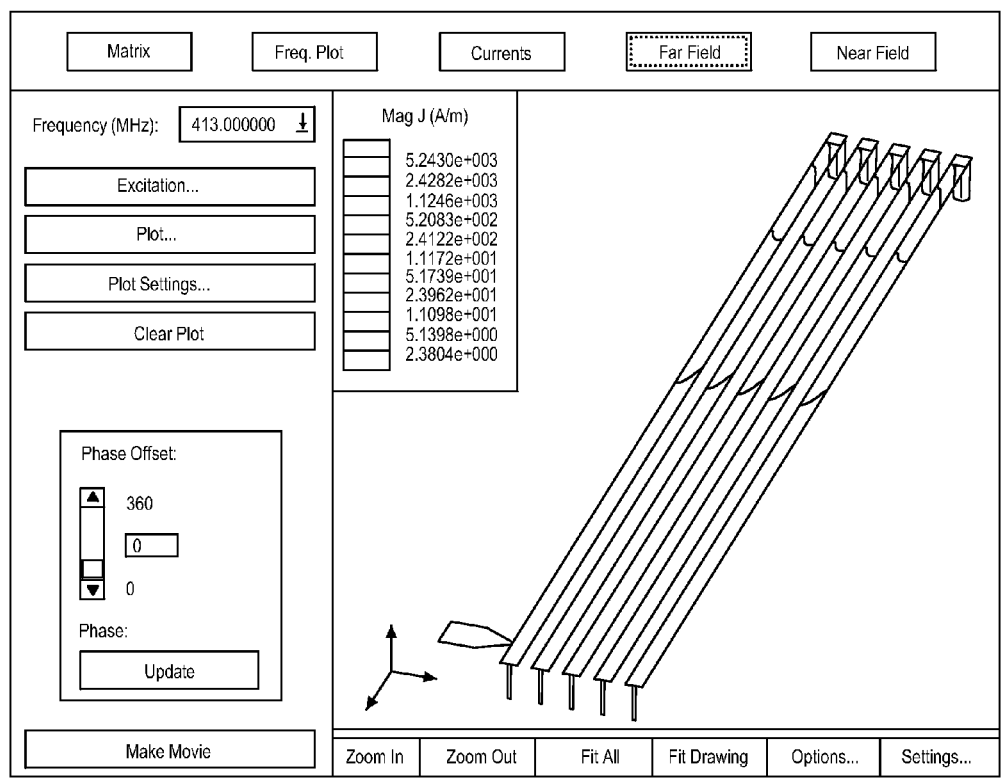
FIG. 4 is an illustration of the structure and high-frequency current induced on five resonating strips.

With the development of the linear resonator, it is thus possible to create an array of strongly coupled linear resonators. FIG. 4 shows the structure and the high-frequency current induced on five resonating strips. The electromagnetic response of the five coupled linear resonators was modeled using the ENSEMBLE™ simulator tool from Ansoft, LLC of Pittsburgh, Pa. The five microdischarge gaps are aligned with each other and can be seen in the upper right corner of the figure. Power is coupled to the leftmost resonator only. The response of the remaining four resonators is due to strong electromagnetic coupling.

Considering an array of n resonators, if one defines the energy stored in the ith resonator as $a_i$, then the coupling among the n resonators can be expressed to lowest order as:

$$da_i/dt=-j(\omega_i-j\Gamma_i)a_i+j\Sigma_{m\neq i}k_m a_m+F_i, (i=1,2,\ldots,n) \quad \text{(Eq. 2)}$$

where $\omega_i$ is the resonance frequency of the ith resonator in isolation, $\Gamma_i$ is the damping factor, $F_i$ is the external input function, and $K_m$ is the coupling coefficient between the ith and mth resonators.

Figure 5:
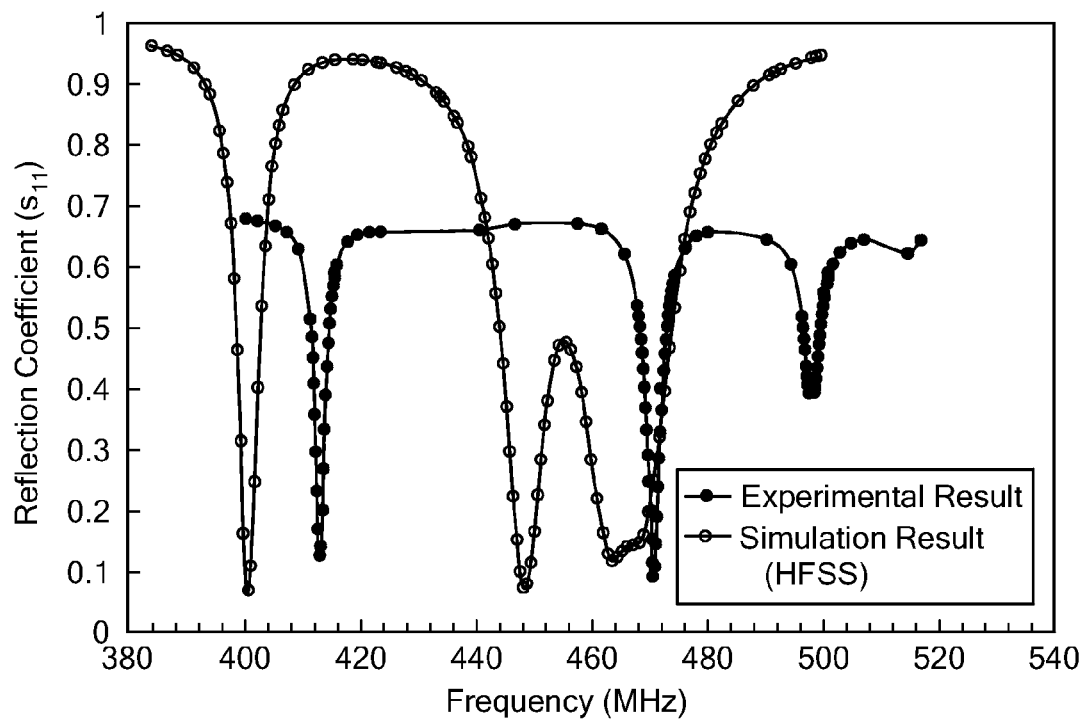
FIG. 5 shows the eigenfrequencies for which power is absorbed for both electromagnetic simulation and measured reflection coefficient for a five-line resonator array.

The solution of the n differential equations in Eq. 2 for an n-resonator system results in n eigenfrequencies for the system of coupled resonators. FIG. 5 shows both the simulated and measured eigenfrequencies for which power is absorbed in the specific case of a five resonator array. The three-dimensional simulation uses ANSOFT HFSS™ and the measurements were taken using an HP 438 A power meter, HP 8481 A power sensors, and a Narda Microwave bidirectional coaxial coupler. Four of the five eigenfrequencies are clearly visible. The last mode overlaps the fourth and is unresolved due to the resonators' finite quality factor, Q. The frequency shift between simulation and experiment is due to thinning of the dielectric substrate during fabrication and the overall decrease of $s_{11}$ is caused by experimental power transmission loss.

Figure 6:
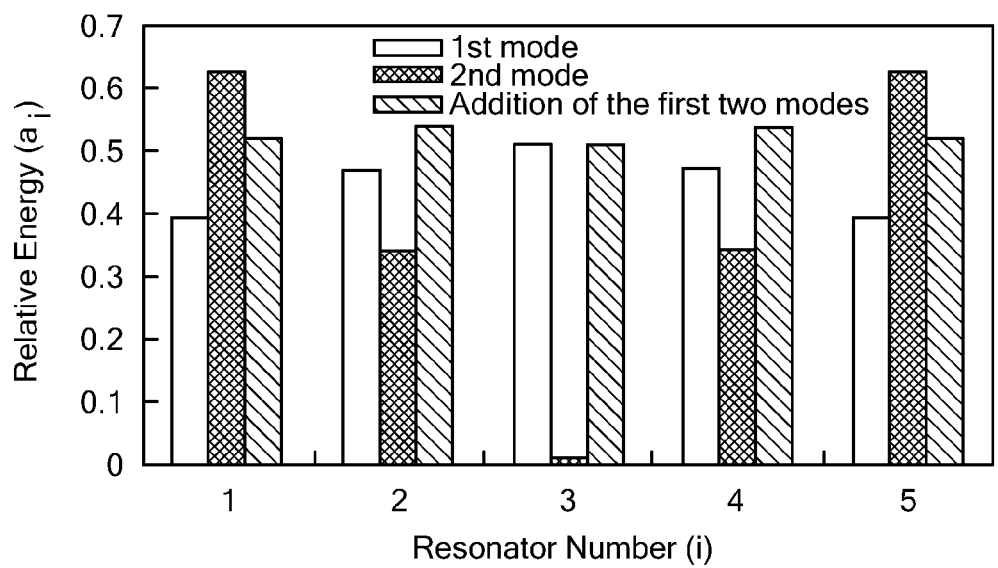
FIG. 6 shows the energy distributions for the first two eigenmodes and the superposition of the first two eigenmodes of a five resonator system.
Figures 7A, 7B, 7C:
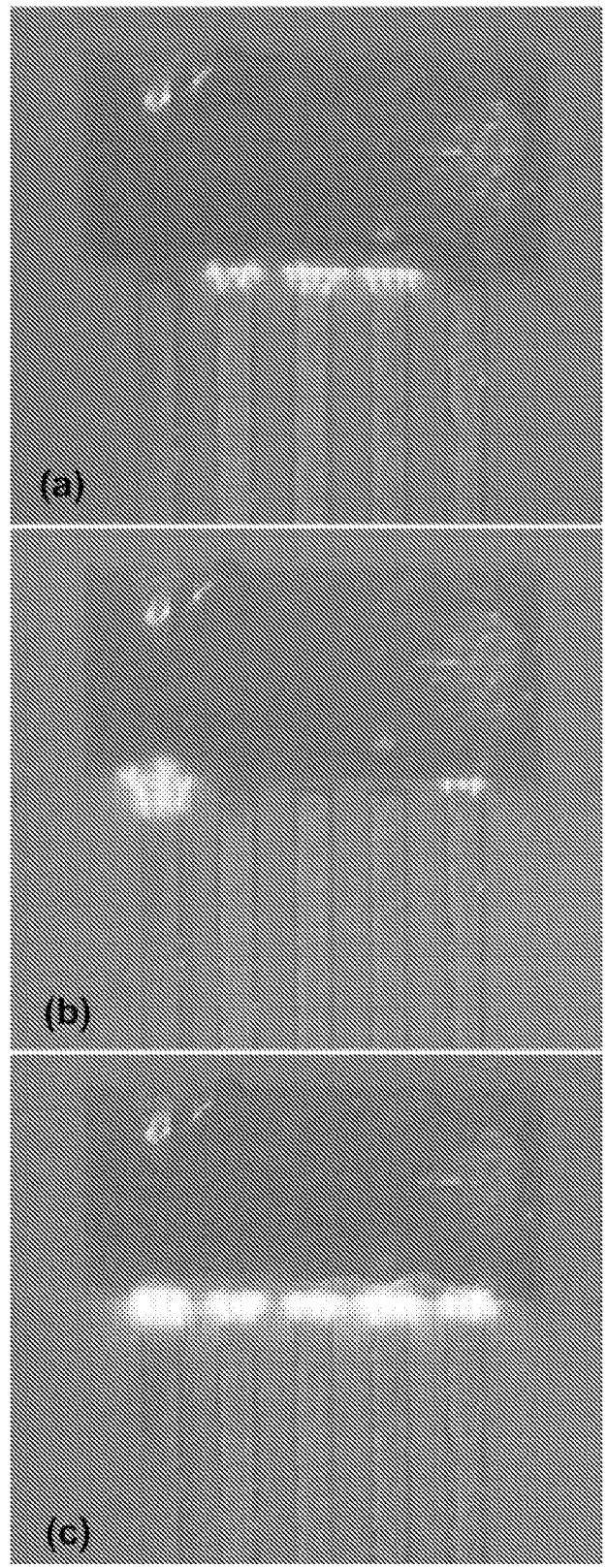
FIG. 7A shows a linear array and the plasma distribution among the discharge gaps for a first mode (f=413 MHz, 0.66 W at 733 Torr)
FIG. 7B shows the linear array and the plasma distribution for a second mode (f=471 MHz, 0.63 W at 731 Torr)
FIG. 7C shows the linear array and the plasma distribution created by a superposition of the first and second modes.

By solving Eq. 2, the distribution of energy among the resonators for the first two eigenmodes is calculated, as shown in FIG. 6, which illustrates energy distributions for the first two eigenmodes and the superposition of the first two eigenmodes of a five-resonator system. These results are also verified by both simulations of the electric field and microplasma generation experiments, as shown in FIGS. 7A and 7B. In all cases, power is applied only to the first resonator (i=1) and the remaining resonators operate through resonant coupling. In order to generate a uniform distribution of plasma along the array, the resonators can be operated by a superposition of the first two eigenmodes (FIG. 6). The discharge produced by the addition of the first two modes also demonstrates improved uniformity, as shown in FIG. 7C. This superposition of modes is simply implemented by combining two frequencies from two rf signal generators using an rf power combiner and applying this amplified waveform to the first resonator only, as described above. In the example shown in FIG. 7C, the plasma is generated from the superposition of 0.54 W at 413 MHz (first mode) and 0.09 W at 471 MHz (second mode), for 0.63 W total power at 733 Torr.

Figure 8:
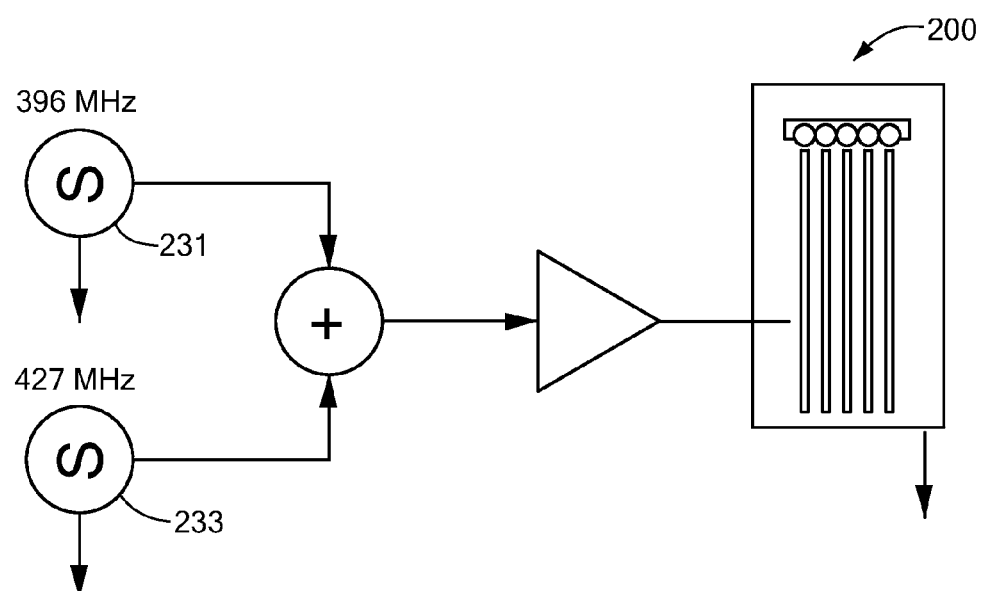
FIG. 8 is a schematic illustration of a microplasma generator array and a power source for providing power at multiple frequencies.
Figure 9:
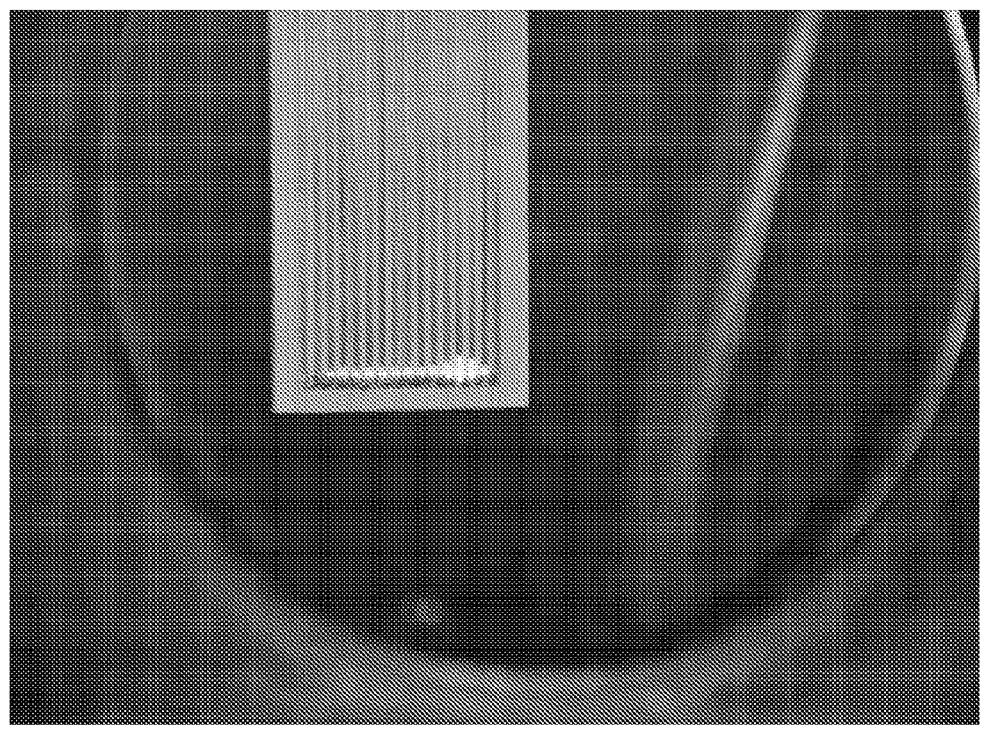
FIG. 9 shows an array with a superimposed frequency input.

In general, the microplasma generator array has N modes of operation, where N is the number of elements in the array. Each mode has a unique frequency at which the array absorbs microwave power. The mode also has a unique pattern of energy distribution amongst the resonators. As schematically illustrated in FIG. 8, the microplasma generator array 200 is powered by two rf generator sources 231, 233, one operating at 396 MHz and the other operating at 427 MHz. These frequencies correspond to excitation frequencies for respective modes of the microplasma generator array 200. As shown in FIG. 8, the two signals from the generators 231, 233 are added together, amplified and applied to the array 200. FIG. 9 shows an array with a superimposed frequency input. In this example, the lower frequency excites the microplasmas toward the center of the array and the higher frequency excites microplasmas towards the ends of the array. The superposition of the two modes provides a nearly uniform line of microplasmas. (In this example, the plasma is slightly larger at the position where the power is directly applied, which is to the right of center, resonator number 4). In this embodiment, two frequencies are added at the input, where each frequency excites a mode of the array. It will be understood that more than two frequencies can be added at the input. In one embodiment, up to N different frequencies, each corresponding to an excitation frequency of a mode of operation of the array, can be added at the input. In one aspect, the superimposition of mode excitation frequencies improves plasma uniformity.

Figure 10:
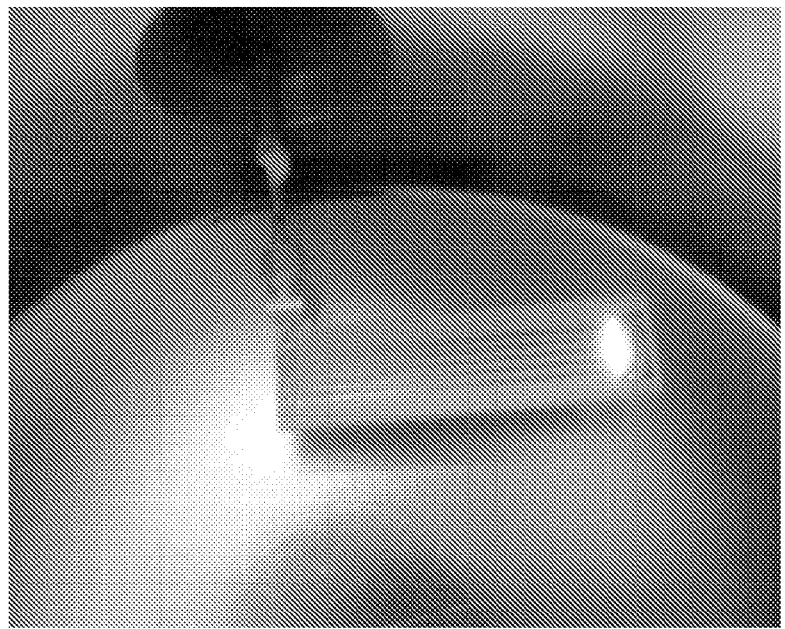
FIG. 10 is a photograph of a linear array of microplasmas according to the invention.

FIG. 10 is a photograph showing an actual linear array of microplasmas operating in argon at approximately ½ atmospheric pressure. Power is supplied to the top-most resonator through the coaxial line at the top of the photograph. All five microplasmas are sustained through close coupling of adjacent resonators. In this embodiment, the microplasma array operates at 413 MHz with 1 watt of power.

Figure 11:
FIG. 11 is a photograph of the array of FIG. 4 with the exposure reduced.

FIG. 11 is a photograph of the linear array of FIG. 10 with the exposure reduced such that the individual microplasmas can be better illustrated.

Figure 12:
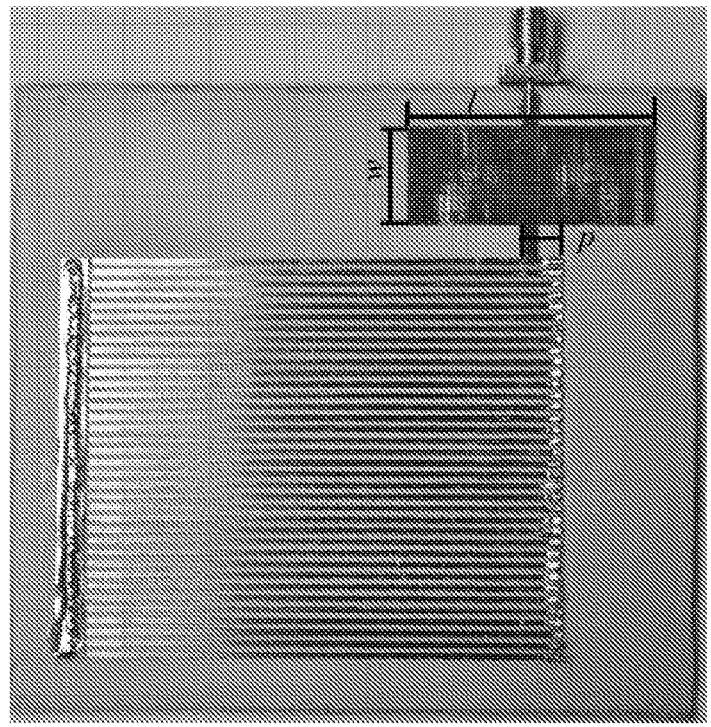
FIG. 12 shows a thirty-six element array.
Figure 13:
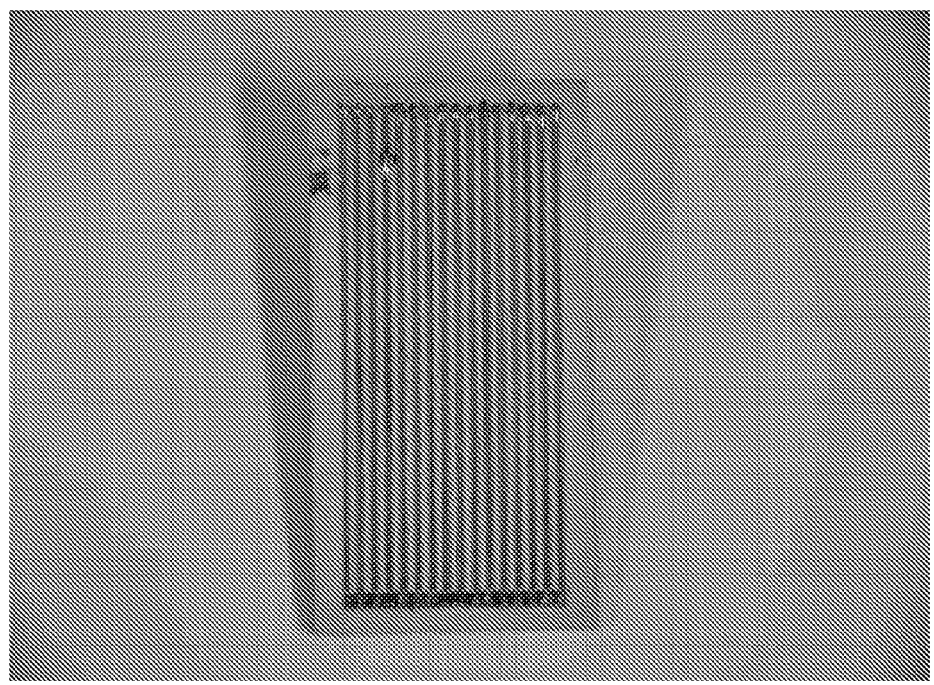
FIG. 13 shows a sixteen element array with the power provided directly to a microstrip line.

FIG. 12 shows an example of a linear microplasma generator array having 36 elements. The large copper patch at the top right corner is an impedance-matching capacitor (area=w×l). The microplasmas form along the left side of the array. The impedance matching is improved by applying the power directly to one of the microstrip lines, as is shown in the 16 element array of FIG. 13. This eliminates the need for the impedance-matching capacitor.

Figure 14:
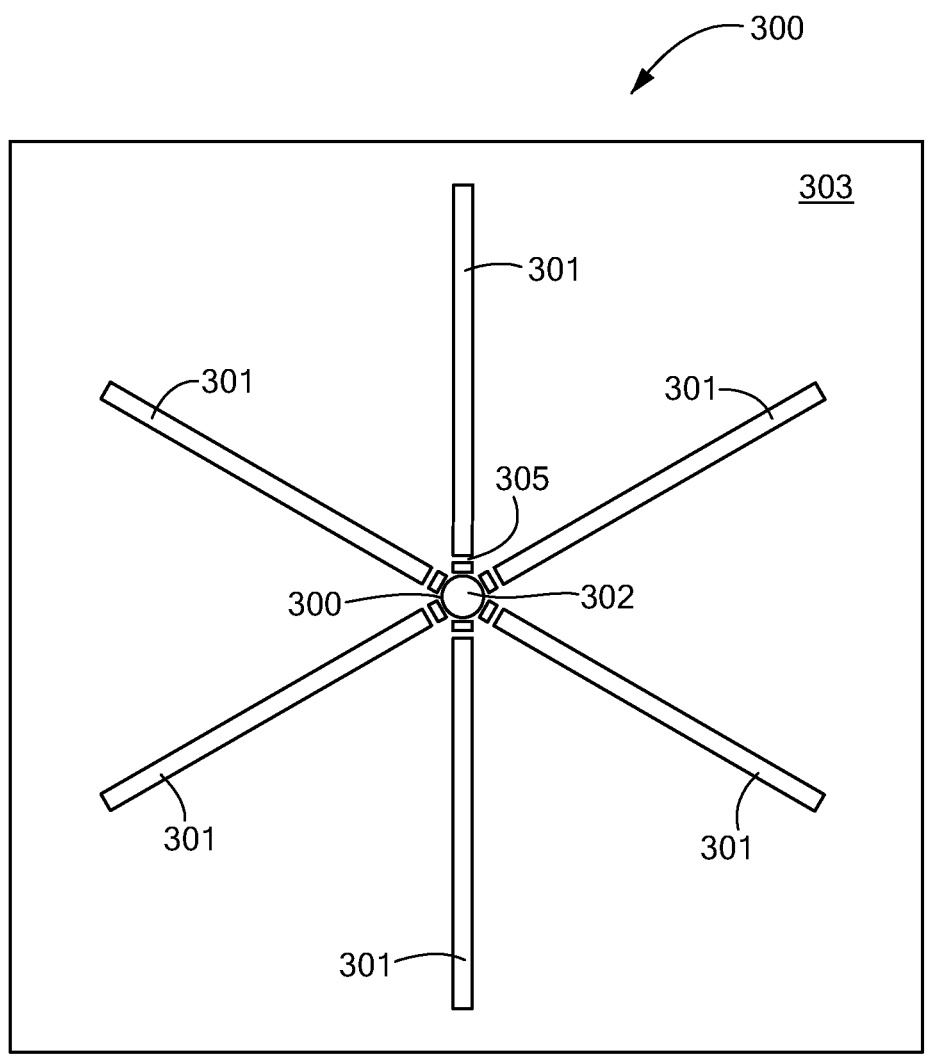
FIG. 14 is a schematic illustration of a microplasma generator array having a circular geometry.

FIG. 14 illustrates a microplasma generator array 300 having a circular geometry. As with the case of the linear array described above, the circular array 300 is driven by strongly-coupled quarter-wave microstrip resonators 301. The array 300 of strips are arranged about a central axis 302 with the gaps 305 in each strip forming a circular pattern. The microplasma generated in each gap 305 overlaps to produce a substantially continuous ring-shaped microplasma.

The circular array configuration is useful for treating the surface of cylindrical objects, tubing, wires, etc. In one embodiment, an opening 307 is provided in the dielectric substrate 305 to allow a work-piece to be moved through the substrate 305 and the center of the plasma. In another embodiment, the microplasma ring can treat fluids (e.g., liquids or gasses) flowing through the center of the plasma ring. For example, in analytical chemical applications, analytes (e.g., proteins in gases or liquids) are photoionized by energetic photons emitted from the ring and then introduced into a mass spectrometer for analysis. In another embodiment, photons from the plasma ring are used to induce fluorescence in gases or liquids (which can flow through a tube through the center of the plasma ring). The optical emission spectrum of the fluorescence signal can then be used to analyze the chemical nature of the sample.

Figure 15:
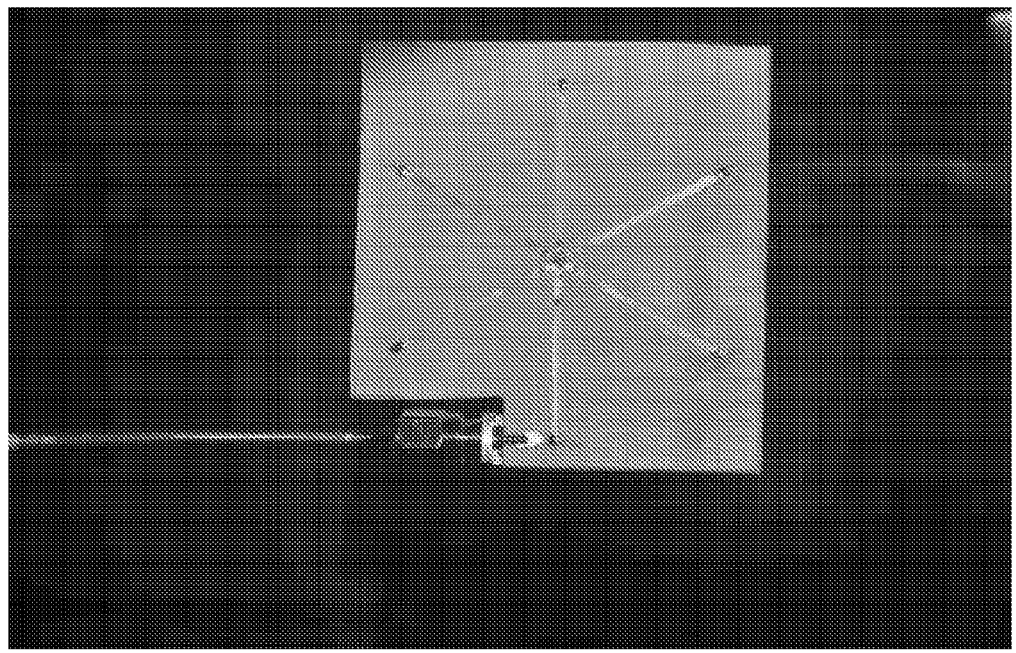
FIG. 15 illustrates the device configuration of a circular array.
Figure 16:
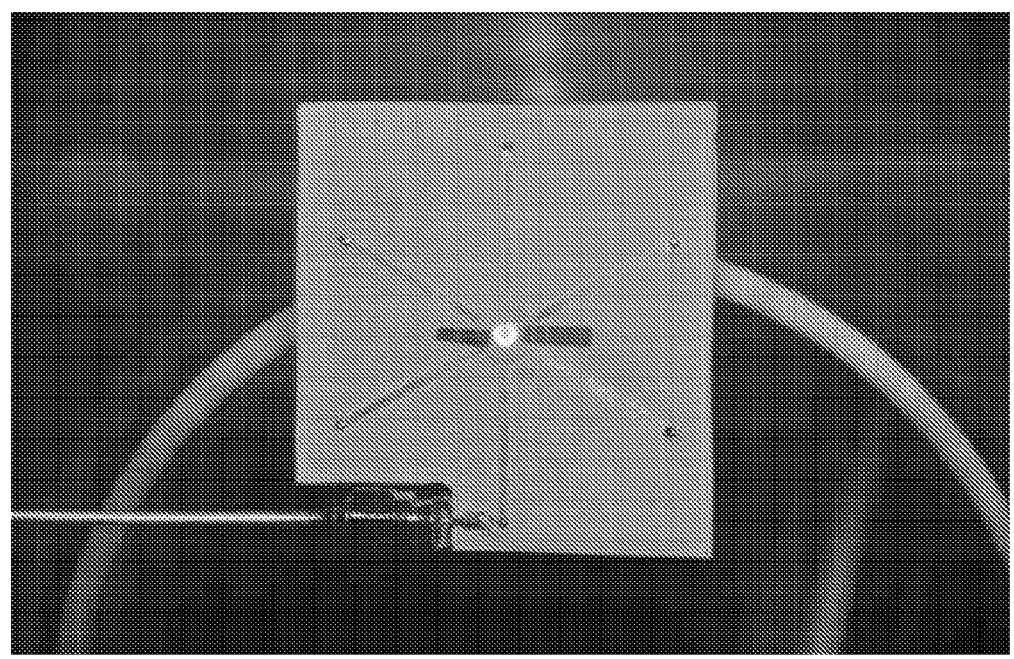
FIG. 16 illustrates a circular array generating a ring-shaped microplasma.

FIGS. 15 and 16 illustrate an exemplary embodiment of a circular array device. FIG. 15 shows the device configuration and FIG. 16 shows the ring-shaped microplasma. An insulating disk is taped to the array to confine the plasma in the central region.

It will be understood that the circular arrays can be operated using multiple input frequencies, as described above, to improve plasma uniformity. Also, in addition to the linear and circular plasma arrays described above, the array can include any suitable geometry including ovals, double planar arrays for creating two plasma lines, and vertical stacking of linear arrays to form three-dimensional arrays.

The microplasma generator devices of the present invention can be fabricated using a substrate of aluminum oxide ($Al_2O_3$), glass, or Duriod™ from Rogers Corporation. The preferred material is aluminum oxide due to its resistance to chemical reactions. Any dielectric that exhibits low electromagnetic loss (i.e., has a low loss tangent) is appropriate. The dielectric thickness may be between 0.1 mm and several mm. The front and back surfaces of the dielectric layer are preferably completely coated with adhesion promoting layers and high conductivity metals. For example, it is often necessary to coat glass substrates with a thin layer of chromium prior to coating with gold to improve adhesion of the gold. The metal layers should all exhibit high electrical conductivity and should preferably not be magnetic materials. Typical metals include copper and gold.

It may be useful to coat the metal layers with a thin protective layer of dielectric (such as glass) or a refractory metal, such as tungsten, on top of the ¼λ microstrip. In certain embodiments, a second dielectric layer can be provided over the metal strips and the ground electrodes such that the metal structures of the microplasma generator are protected from the plasma. The microplasma forms on the upper surface of this protective dielectric layer. The layer can be comprised of any dielectric, though glass and aluminum oxide are preferred. The thickness of this protective dielectric layer can be between, for example, 1 micrometer and 500 micrometers. Thicker protective layers will provide more protection, though the intensity of the microplasma is reduced with thicker protective layers.

The structures that comprise the metal layers of the device can then be formed by, for example, (1) milling the unwanted surface layers using a circuit board prototyping tool (e.g., an LPKF circuit board milling tool can be used to pattern Duriod/copper laminates), or (2) by photolithographically defining the desired structures (according to procedures known in the electronics industry) and then etching the metal layers using acids or plasmas with the photoresist mask protecting the structures that are desired to be preserved. A further fabrication method is the definition of the metal structures by photolithography directly on the dielectric substrate followed by deposition of metal on the photoresist layer. Removal of the photoresist layer leaves a metal pattern on the dielectric; this process is known as lift-off. All of these procedures are commonly practiced by the electronics industry, and in particular the microwave integrated circuit industry.

Typical feature sizes for the device are, according to some embodiments:

Gap: 1 micrometer to 1000 micrometers with a preferred gap width of 25-250 micrometers depending on the gas used (air=20 microns; argon=200 microns)

Microstrip width: 1 mm

Microstrip length: λ/4 (approximately 60 mm at 450 MHz using $Al_2O_3$; the length depends on the relative dielectric constant)

Microstrip thickness: 50 microns

Dielectric thickness: 2.5 mm

Power Frequency: 100 MHz to 10 GHz (preferably ~1-3 GHz)

Power: 0.1-1.0 watts per strip (though this parameter is gas and process dependent).

Thin-Film Deposition

An advantage of the present low-temperature atmospheric-pressure microplasma generator is that it can be used in numerous industrial processing applications. For example, the microplasma generator can be used to deposit high-quality thin films on a variety of substrate materials, including inexpensive commodity substrates, such as plastics.

Currently, the most common methods of depositing device-quality semiconductor (e.g., silicon) films on a substrate are (1) high-temperature chemical vapor deposition (CVD), and (2) low-pressure plasma-enhanced CVD (PECVD). The high temperatures required by the former method are incompatible with cost-effective substrates, and therefore CVD methods are generally restricted to expensive silicon wafers. The latter method, PECVD, requires expensive and complicated high-vacuum technology and batch processing. An advantage of PECVD is that it is capable of low-temperature operation because energetic plasma electrons, rather than thermal processes, drive the necessary chemical reactions. Thus, PECVD can be used with more cost-effective substrates, such as glass.

Figure 17:
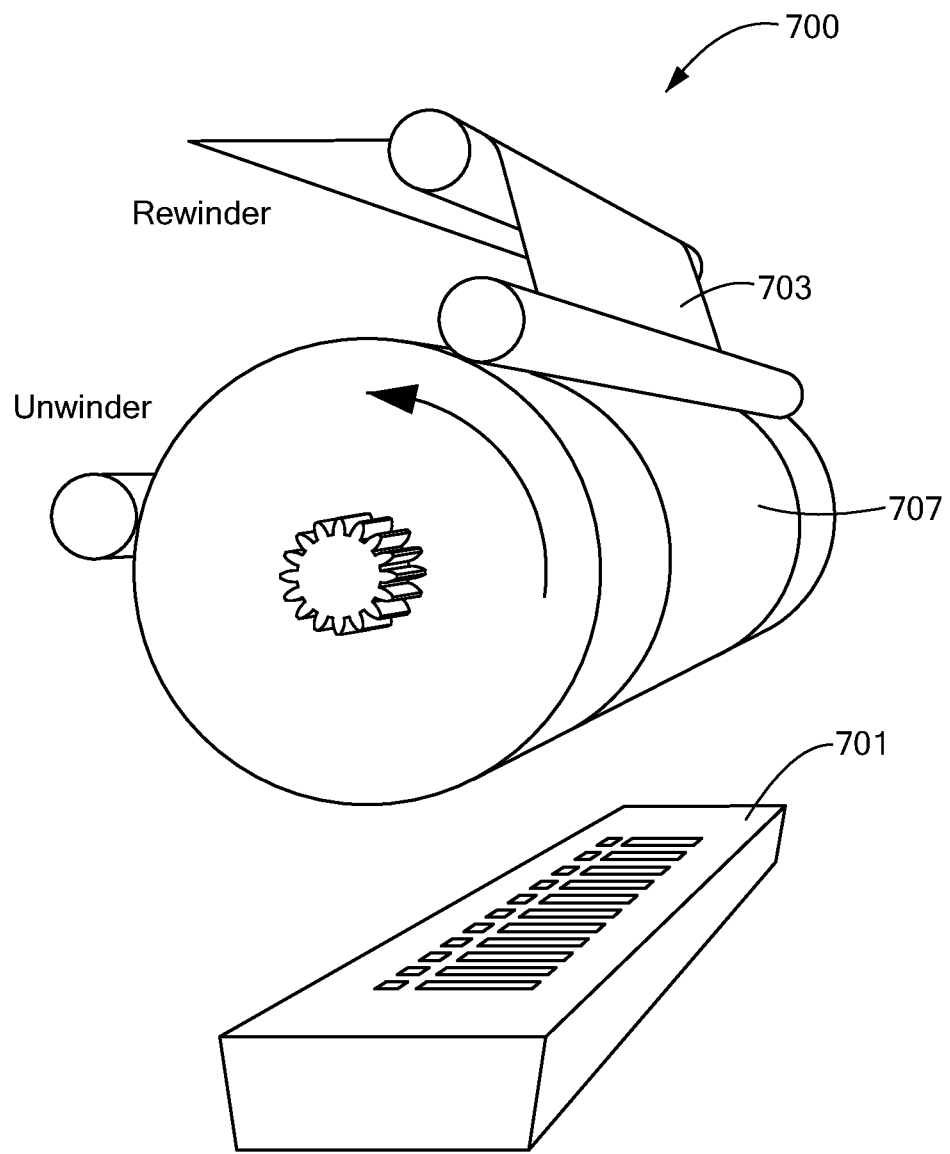
FIG. 17 is a schematic illustration of a roll-to-roll coating apparatus using a linear microplasma array according to one aspect of the invention.

FIG. 17 illustrates an apparatus 700 for depositing thin-films on a substrate 703 using a microplasma generator 701. In this embodiment, the apparatus 700 comprises a roll-to-roll coating apparatus, in which the substrate 703 is unwound, fed through a coating roller 705 where the substrate is coated with a thin film 707 using low-temperature, atmospheric-pressure plasma, and is then rewound.

Roll-to-roll coating technology is a widely used, low-cost method for depositing metal films on inexpensive substrates, such as plastics. In the manufacturing of potato chip bags, for example, a roll-coating process is used to deposit high-quality metal films on the inside of these plastic bags at negligible cost. The metal (typically aluminum) may be evaporated using energy from an electron beam evaporator. Although roll coating processes are currently used for metal deposition on plastic, existing roll coating technologies are unsuitable for more complex applications, such as depositing semiconductor materials and photovoltaic device fabrication.

In one embodiment of the present invention, the present linear microplasma generator array is used in a roll-to-roll coating process to coat substrates, including low-cost commodity substrates like plastics, with high-quality films, including device grade silicon thin films. This roll-to-roll deposition process using low-temperature, atmospheric-pressure plasma is advantageous relative to conventional CVD and PECVD processes, since it can be performed on low temperature substrates (unlike CVD) and at or near atmospheric pressures (unlike conventional PECVD). Accordingly, the complex and expensive vacuum technology and batch processing of conventional PECVD techniques can be avoided, and inexpensive coating techniques, such as roll-to-roll coating can be performed at or near atmospheric pressure.

In the roll coating apparatus 700 of FIG. 17, the microplasma generator 701 preferably comprises an array of coupled linear resonators, such as shown in FIG. 3, that generate a substantially continuous line of plasma. The number of resonators can vary depending on the particular application, though generally a large number (e.g., ~100 or more) is desired to provide a wide area of plasma generation. Ideally, the "line" of plasma traverses the entire width of the roller 705 to provide uniform coating of the substrate.

The microplasma generator 701 preferably provides a stabilized, high plasma density ($n_e \sim 10^{14}$ cm$^{-3}$) line of plasma. The high-density of ions from a stable linear microplasma array provide a high energy flux (that is, a high flux of low energy ions) sufficient to enable deposition of thin-film layers on a substrate. It is believed, for example, that the present linear microplasma array is able to provide an ion flux that is three orders higher than other reported attempts at film deposition (e.g., dielectric barrier discharges).

In a film coating process, the linear plasma is used to dissociate gas molecules in the vicinity of the plasma and to deposit a film on the substrate using the dissociated molecular fragments. Preferably, the deposition is performed at or near atmospheric pressure. In one aspect, the linear plasma dissociates silane gas ($SiH_4$) and deposits a high-quality silicon film on the substrate. In other embodiments, the plasma dissociates hydrocarbon gas ($CH_4$) and deposits an amorphous carbon film. Various other films can be deposited in this manner, as will be understood by one skilled in the art.

The roll-to-roll coating method and apparatus of FIG. 17 is only one implementation of a thin-film deposition process using a linear microplasma array. It will be understood by those skilled in the art that the present linear microplasma array can be utilized to deposit material on a substrate using any suitable plasma-based deposition techniques.

In addition to deposition processes, the linear microplasma array can be utilized to alter the surface of a substrate by removing material from a substrate (i.e., etching) using a suitable reactive gas, such as $CF_4$, in the vicinity of the microplasma. The microplasma array can also be used to modify the surface chemistry of the substrate using oxygen, water vapor, etc. These processes can advantageously be performed using low-temperature plasma and at atmospheric or near atmospheric pressures. Furthermore, in addition to the linear plasma array, a plasma array having other geometries can be used for altering the surface of a substrate, such as the circular geometry described above.

The atmospheric linear plasma can also have applications in the field of airfoil actuators for efficient windpower generation and aircraft design. The addition of plasma flow to control surfaces has shown interesting results in maintaining laminar flow at high angles of attack, for example. The present thin film deposition technology can also have applications, for example, in the creation of novel catalyst materials.

Other applications of the present microplasma generator include light sources, a line source of VUV, UV and visible photons, information displays, analytical chemistry, ionization or excitation of chemical samples for analytical purposes (e.g., mass spectrometry, gas chromatography, atomic and molecular emission spectrometry), UV fluorescence measurements and electron sources for charging particles (e.g., photocopying, particle detectors).

While the present invention has been described in conjunction with preferred embodiments thereof, one of ordinary skill, after reading the foregoing specification, will be able to effect various changes, substitutions of equivalents, and other alterations to the compositions and methods set forth herein. It is therefore intended that the protection granted by Letters Patent hereon be limited only by the definitions contained in the appended claims and equivalents thereof.

What is claimed is:

1. A plasma generator, comprising:
   a substrate having a first surface and a second surface;
   a linear strip having a first end and a second end provided on the first surface of the substrate, the linear strip having a length that is an odd integer multiple of λ/4 at an operating frequency;
   a ground plane provided on the second surface of the substrate, the first end of the strip being connected to the ground plane;
   a ground electrode provided on the first surface of the substrate adjacent to, and spaced apart from, the second end of the strip to define a discharge gap between the second end of the strip and the ground electrode, wherein the ground electrode is connected to the ground plane; and a power connector coupled to the strip for connection to a power source for supplying power to the plasma generator.

2. The plasma generator of claim 1, wherein the substrate is a planar substrate comprising a dielectric material.

3. The plasma generator of claim 1, wherein the strip comprises a metal.

4. The plasma generator of claim 1, further comprising a first via provided through the substrate connecting the first end of the strip to the ground plane, and a second via provided through the substrate connecting the ground electrode to the ground plane.

5. The plasma generator of claim 1, wherein the power connector is connected to the strip at a position on the strip to provide an impedance matched to that of the power source.

6. The plasma generator of claim 1, wherein the power supplied to the strip comprises microwave power.

7. The plasma generator of claim 1, wherein the generator produces a plasma at atmospheric or near-atmospheric pressure.

8. The plasma generator of claim 7, wherein the temperature of the plasma is between 300 and 1000 K.

9. The plasma generator of claim 1, further comprising a protective layer provided over the strip and the ground electrode.

10. A plasma generator array, comprising:
a substrate having a first surface and a second surface;
a plurality of strongly-coupled resonant linear strips provided on the first surface of the substrate, each strip having a first end and a second end;
a ground plane provided on the second surface of the substrate, the first end of each strip being connected to the ground plane;
a plurality of ground electrodes provided on the first surface of the substrate, each ground electrode connected to the ground plane, and each ground electrode positioned adjacent to, and spaced apart from, the second end of a respective strip to define a respective discharge gap therebetween, the discharge gaps being adjacent to one another; and
a power connector for connection to a power source and coupled to at least one strip of the plurality of strips.

11. The plasma generator array of claim 10, wherein the discharge gaps are substantially collinear with one another.

12. The plasma generator array of claim 10, wherein each strip has a length that is an odd integer multiple of $\lambda/4$ at an operating frequency.

13. The plasma generator array of claim 10, wherein the power source provides microwave power.

14. The plasma generator array of claim 10, wherein the plurality of strips comprises at least 100 strips.

15. The plasma generator array of claim 10, wherein the power connector is coupled to only one strip.

16. The plasma generator array of claim 10, wherein the array produces a substantially continuous plasma at atmospheric or near-atmospheric pressure.

17. The plasma generator array of claim 16, wherein the discharge gaps are arranged in a substantially linear configuration.

18. The plasma generator array of claim 16, wherein the temperature of the plasma is between 300 and 1000 K.

19. The plasma generator array of claim 10, further comprising a protective layer provided over the resonant strips and the ground electrodes.

20. The plasma generator array of claim 10, wherein the discharge gaps are arranged in a generally circular configuration.

21. The plasma generator array of claim 20, wherein the array produces a substantially continuous ring-shaped plasma at atmospheric or near-atmospheric conditions.

22. The plasma generator array of claim 10, wherein the power source provides an input power including two or more frequencies.

23. The plasma generator array of claim 22, wherein each of the frequencies excites a different operating mode of the array.

24. The plasma generator array of claim 22, wherein the frequencies comprise eigenfrequencies of the array.

25. The plasma generator array of claim 10, further comprising an opening extending through the substrate, the discharge gaps being arranged around the opening to provide a substantially ring-shaped plasma.

* * * * *